(12) United States Patent
Edmond et al.

(10) Patent No.: US 8,101,961 B2
(45) Date of Patent: Jan. 24, 2012

(54) TRANSPARENT OHMIC CONTACTS ON LIGHT EMITTING DIODES WITH GROWTH SUBSTRATES

(75) Inventors: John A. Edmond, Cary, NC (US); David B. Slater, Jr., Durham, NC (US); Michael J. Bergmann, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 509 days.

(21) Appl. No.: 11/738,122

(22) Filed: Apr. 20, 2007

(65) Prior Publication Data

US 2008/0083930 A1 Apr. 10, 2008

Related U.S. Application Data

(63) Continuation-in-part of application No. 11/539,423, filed on Oct. 6, 2006, now Pat. No. 7,473,938, and a continuation-in-part of application No. 11/338,918, filed on Jan. 25, 2006.

(51) Int. Cl.
*H01L 33/00* (2010.01)

(52) U.S. Cl. ............. 257/98; 257/79; 257/99; 257/101; 257/E33.064

(58) Field of Classification Search ............ 257/79, 257/95, 98, 101, 103, E33.023, 99, E33.063, 257/E33.064
See application file for complete search history.

(56) References Cited

U.S. PATENT DOCUMENTS

| | | | |
|---|---|---|---|
| 4,822,144 A * | 4/1989 | Vriens | 349/71 |
| 4,860,069 A | 8/1989 | Yamazaki | |
| 4,894,703 A | 1/1990 | Hamamsy et al. | |
| 5,077,587 A | 12/1991 | Albergo et al. | |
| 5,113,233 A | 5/1992 | Kitagawa et al. | |
| 5,214,306 A | 5/1993 | Hashimoto | |
| RE34,861 E | 2/1995 | Davis et al. | |
| 5,393,993 A | 2/1995 | Edmond et al. | |
| 5,404,282 A | 4/1995 | Klinke et al. | |
| 5,416,342 A | 5/1995 | Edmond et al. | |
| 5,523,589 A | 6/1996 | Edmond et al. | |
| 5,550,091 A | 8/1996 | Fukuda et al. | |
| 5,563,422 A * | 10/1996 | Nakamura et al. | 257/13 |

(Continued)

FOREIGN PATENT DOCUMENTS

EP 0357458 A2 3/1990

(Continued)

OTHER PUBLICATIONS

Jong et al., "Enhancement of Light Extraction in GaInN Light-Emitting Diodes with Graded-Index Indium Tin Oxide Layer," 2007 Conference on Lasers and Electro-Optics, May 5-11, 2007, Baltimore, MD, pp. 1325-1326.

(Continued)

*Primary Examiner* — Lex Malsawma
*Assistant Examiner* — Robert Huber
(74) *Attorney, Agent, or Firm* — Koppel, Patrick, Heybl & Philpott

(57) ABSTRACT

A light emitting diode is disclosed that includes a growth substrate, a substantially transparent ohmic contact on a first surface of the growth substrate, a Group III nitride, light-emitting active region on a second surface of the growth substrate, a p-type Group III nitride contact layer on the active region that transmits light generated in the active region, and a substantially transparent ohmic contact on the p-type contact layer.

45 Claims, 3 Drawing Sheets

U.S. PATENT DOCUMENTS

| | | | |
|---|---|---|---|
| 5,567,523 | A | 10/1996 | Rosenblum et al. |
| 5,578,839 | A | 11/1996 | Nakamura et al. |
| 5,583,351 | A | 12/1996 | Brown et al. |
| 5,585,648 | A | 12/1996 | Tischler |
| 5,592,501 | A | 1/1997 | Edmond et al. |
| 5,616,937 | A | 4/1997 | Kitagawa et al. |
| 5,652,434 | A | 7/1997 | Nakamura et al. |
| 5,708,280 | A | 1/1998 | Lebby et al. |
| 5,739,554 | A | 4/1998 | Edmond et al. |
| 5,767,581 | A | 6/1998 | Nakamura et al. |
| 5,798,537 | A * | 8/1998 | Nitta .......................... 257/103 |
| 5,812,105 | A | 9/1998 | Van de ven |
| 5,813,752 | A | 9/1998 | Singer et al. |
| 5,813,753 | A * | 9/1998 | Vriens et al. ................. 362/293 |
| 5,877,558 | A | 3/1999 | Nakamura et al. |
| 5,959,401 | A | 9/1999 | Asami et al. |
| 6,258,617 | B1 | 7/2001 | Nitta et al. |
| 6,268,618 | B1 * | 7/2001 | Miki et al. ........................ 257/99 |
| 6,344,663 | B1 | 2/2002 | Slater, Jr. et al. |
| 6,380,564 | B1 | 4/2002 | Chen et al. |
| 6,429,460 | B1 * | 8/2002 | Chen et al. ....................... 257/79 |
| 6,445,007 | B1 | 9/2002 | Wu et al. |
| 6,459,100 | B1 | 10/2002 | Doverspike et al. |
| 6,524,971 | B1 | 2/2003 | Fetter et al. |
| 6,586,781 | B2 | 7/2003 | Wu et al. |
| 6,586,876 | B2 * | 7/2003 | Tsai et al. ...................... 313/509 |
| 6,717,362 | B1 | 4/2004 | Lee et al. |
| 6,781,305 | B1 * | 8/2004 | Fujii ............................ 313/504 |
| 6,791,119 | B2 | 9/2004 | Slater, Jr. et al. |
| 6,825,501 | B2 | 11/2004 | Edmond et al. |
| 6,946,682 | B2 | 9/2005 | Slater et al. |
| 6,995,401 | B2 * | 2/2006 | Yamada et al. ................. 257/79 |
| 7,026,659 | B2 | 4/2006 | Slater, Jr. et al. |
| 7,259,402 | B2 | 8/2007 | Edmond et al. |
| 7,473,938 | B2 | 1/2009 | Edmond et al. |
| 2001/0023964 | A1 | 9/2001 | Wu et al. |
| 2002/0030194 | A1 | 3/2002 | Camras et al. |
| 2003/0062530 | A1 | 4/2003 | Okazaki et al. |
| 2004/0135166 | A1 | 7/2004 | Yamada et al. |
| 2005/0001952 | A1 | 1/2005 | Han |
| 2005/0082562 | A1 | 4/2005 | Ou et al. |
| 2005/0095737 | A1 | 5/2005 | Edmond et al. |
| 2006/0006554 | A1 | 1/2006 | Yoo et al. |
| 2006/0060874 | A1 | 3/2006 | Edmond et al. |
| 2006/0094145 | A1 | 5/2006 | Otsuka et al. |
| 2006/0131599 | A1 | 6/2006 | Slater, Jr. et al. |
| 2006/0175628 | A1 | 8/2006 | Otsuka et al. |
| 2006/0186418 | A1 | 8/2006 | Edmond et al. |
| 2006/0202217 | A1 | 9/2006 | Ro et al. |
| 2006/0273336 | A1 | 12/2006 | Fujikura et al. |
| 2007/0018180 | A1 | 1/2007 | Lai et al. |
| 2007/0037307 | A1 | 2/2007 | Donfrio |
| 2007/0102692 | A1 | 5/2007 | Asahara et al. |
| 2007/0114515 | A1 | 5/2007 | Aoyagi et al. |
| 2008/0003777 | A1 | 1/2008 | Slater et al. |
| 2008/0073665 | A1 | 3/2008 | Slater et al. |
| 2008/0197378 | A1 | 8/2008 | Kong et al. |
| 2008/0258161 | A1 | 10/2008 | Edmond et al. |

FOREIGN PATENT DOCUMENTS

| | | |
|---|---|---|
| EP | 0404565 A1 | 12/1990 |
| EP | 0622858 A2 | 11/1994 |
| EP | 1052705 A1 | 11/2000 |
| EP | 1278249 A1 | 1/2003 |
| EP | 1486818 | 12/2004 |
| JP | 07-326823 | 12/1995 |
| JP | 09-191160 | 7/1997 |
| JP | 2002026385 | 1/2002 |
| JP | 2003133590 | 5/2003 |
| WO | WO 96/24167 A1 | 8/1996 |
| WO | WO 99/10936 | 3/1999 |
| WO | 2006006556 | 1/2006 |
| WO | 2007029842 | 3/2007 |
| WO | 2008130823 | 10/2008 |

OTHER PUBLICATIONS

International Search Report of foreign counterpart application No. PCT/US2008/059381; mailing date Feb. 13, 2009; pp. 3.

International Search Report of related foreign counterpart International Application No. PCT/US2008/059390 mailed Aug. 22, 2008, 4 pages.

Ishikawa, Hidenori, et al.; "Effects of Surface Treatments and Metal Work Functions on Electrical Properties at p-GaN/Metal Interfaces," J.Appl.Phys., vol. 81, No. 3, Feb. 1, 1997, pp. 1315-1322.

Sze, Physics of Semiconductor Materials, 2nd Edition (1981), pp. 697-700.

Office Action form Chinese Application No. 200880020967.9, dated Dec. 10, 2010.

Notification of the First Office Action in counterpart Chinese Patent Application No. 200880020967.9 dated Dec. 11, 2010.

* cited by examiner

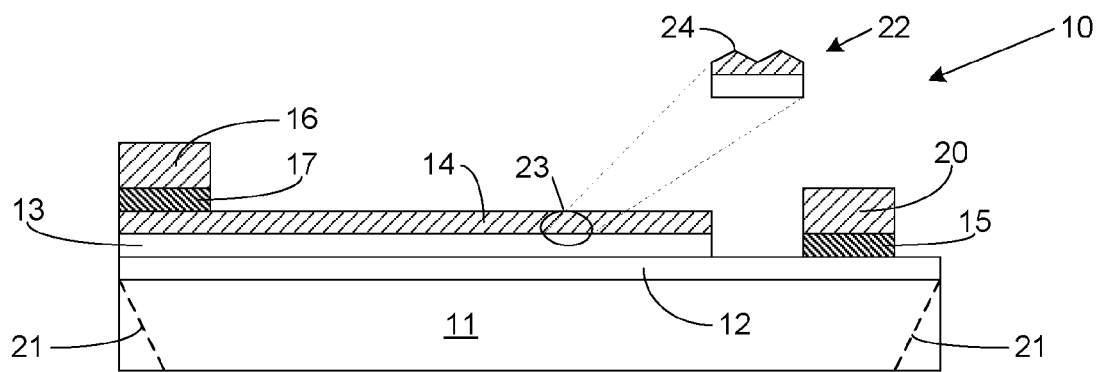
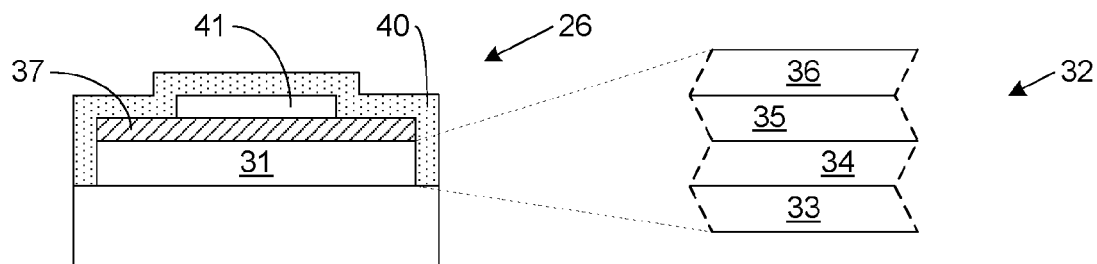
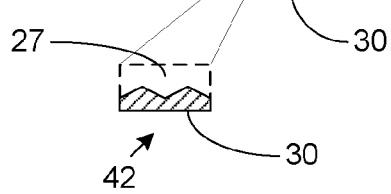
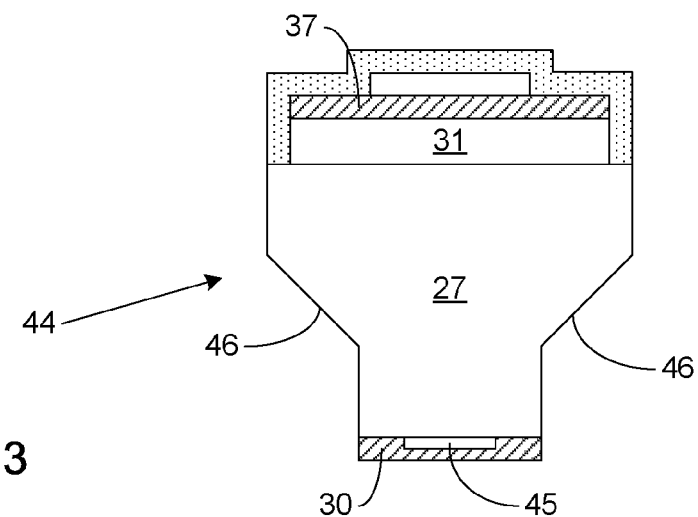
Fig. 1
Fig. 2
Fig. 3

TRANSPARENT OHMIC CONTACTS ON LIGHT EMITTING DIODES WITH GROWTH SUBSTRATES

RELATED APPLICATIONS

This is a continuation in part of Ser. No. 11/539,423 filed Oct. 6, 2006, now U.S. Pat. No. 7,473,938, and of Ser. No. 11/338,918 filed Jan. 25, 2006, and now published as No. 20060131599. The contents of these applications are incorporated entirely herein by reference.

BACKGROUND

The present invention relates to light emitting diodes and in particular relates to increasing the external quantum efficiency of light emitting diodes that include at least portions of the substrates on which the light emitting epitaxial layer's are grown.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

Light emitting diodes share a number of the favorable characteristics of other semiconductor devices. These include generally robust physical characteristics, long lifetime, high reliability, and, depending upon the particular materials, low cost.

A number of terms are used herein that are common and well-understood in the industry. In such industry use, however, these terms are sometimes informally blended in their meaning. Accordingly, these terms will be used as precisely as possible herein, but in every case their meaning will be clear in context.

Accordingly, the term "diode" or "chip" typically refers to the structure that minimally includes two semiconductor portions of opposite conductivity types (p and n) along with some form of ohmic contacts to permit current to be applied across the resulting p-n junction.

The term "lamp" is used to designate a light emitting diode that is matched with an appropriate electrical contact and potentially a lens to form a discrete device that can be added to or included in electrical circuits or lighting fixtures or both.

As used herein, the term "package" typically refers to the placement of the semiconductor chip on an appropriate physical and electrical structure (sometimes as simple as a small piece of metal through which the electrical current is applied) along with a plastic lens (resin, epoxy, encapsulant) that provides some physical protection to the diode and can optically direct the light output.

Appropriate references about the structure and operation of light emitting diodes and diode lamps include Sze, PHYSICS OF SEMICONDUCTOR DEVICES, 2d Edition (1981) and Schubert, LIGHT-EMITTING DIODES, Cambridge University Press (2003).

The color emitted by an LED is largely defined by the material from which it is formed. Diodes formed of gallium arsenide (GaAs) and gallium phosphide (GaP) tend to emit photons in the lower energy (red and yellow) portions of the visible spectrum. Materials such as silicon carbide (SiC) and the Group III nitrides have larger bandgaps and thus can generate photons with greater energy that appear in the green, blue, violet and ultraviolet portions of the electromagnetic spectrum.

In some applications, an LED is more useful when its output is moderated or converted to a different color. As the availability of blue-emitting LEDs has greatly increased, the incorporation of yellow-emitting phosphors that down-convert the blue photons has likewise increased. The combination of the blue light emitted by the diode and the yellow light emitted by the phosphor can create white light. In turn, the availability of white light from solid-state sources provides the capability to incorporate them in a number of applications, particularly including illumination and as lighting (frequently backlighting) for color displays. In such devices (e.g., flat computer screens, personal digital assistants, and cell phones), the blue LED and yellow phosphor produce white light which is then distributed in some fashion to illuminate the color pixels. Such color pixels are often formed by a combination of liquid crystals, color filters and polarizers, and the entire unit including the backlighting is generally referred to as a liquid crystal display. ("LCD").

As the use of light emitting diodes has commercially increased and as the understanding of the basic characteristics of diodes that produce white light has matured, the advances of interest in the technology tend to be those that increase the total amount of light that is produced by a given diode structure, all other factors being equal.

In this regard, the number of individual photons produced by a diode in any given amount of time depends upon the number of recombination events occurring in the diode, with the number of photons generally being less than the number of recombination events (i.e., not every event produces a photon). In turn, the number of recombination events depends upon the amount of current flowing through the diode. Once again the number of recombination events will typically be less than the number of carriers injected across the junction. Thus, these optoelectronic properties can reduce the external output of the diode.

Additionally, when photons are produced, they must also actually leave the diode and the lamp to be perceived by an observer. Although many photons will leave the lamp without difficulty, a number of well-understood effects prevent some fraction of the photons from leaving. These effects arise from the difference in refractive index of the various materials within the diode, and thus reduce the external output of an LED lamp (i.e., its efficiency). These include internal reflection of a photon until it attenuated and emitted or absorbed (i.e., Snell's Law and Fresnel Loss) rather than emitted. The difference in the index of refraction between the materials in the diode can also change the direction of an emitted photon (Snell's Law) towards an object that subsequently attenuates or absorbs it. The same results can occur for yellow photons that are emitted by the phosphor in a phosphor-containing LED lamp. In an LED lamp such "objects" can include the substrate, parts of the packaging, and the metal contact layers. Indeed, the same quantum mechanical characteristics that permit semiconductor materials to emit photons will also cause them to absorb photons. Thus, even the light emitting epitaxial layers in an LED can absorb emitted photons and reduce the overall external efficiency of the diode.

Many semiconductor devices, including many light emitting diodes, consist in basic form of a semiconductor substrate and epitaxial layers of semiconductor materials on the substrate. The epitaxial layers often (although not necessarily exclusively) form the active portions of the device. They are generally favored for this purpose because they are grown in a manner (frequently chemical vapor deposition) that increases both their chemical purity and produces a highly ordered crystal structure. Additionally, chemical vapor deposition provides an excellent technique for precisely doping an epitaxial layer. In turn, the appropriate purity, crystal structure and doping are typically desired or necessary for successful operation of the semiconductor device.

The chemical vapor deposition (CVD) and related techniques used to fabricate epitaxial layers are, however, generally more time-consuming than other crystal growth techniques such as sublimation or growth from a melt (sometimes referred to as bulk growth). As a result, these more rapid (comparatively) methods are often used to produce an appropriate crystal when the intended structure is other than an epitaxial layer.

Thus, by combining a bulk-growth substrate with epitaxial layers, an overall structure can be produced with a reasonable combination of crystal structure, compositional purity, doping, and efficient fabrication.

Nevertheless, for several crystal growth-related reasons, bulk (i.e., reasonably large size) single crystals of Group III nitrides are, for practical purposes, unavailable. Accordingly, Group III nitride LEDs are typically formed on other bulk substrate materials, most commonly sapphire ($Al_2O_3$) and silicon carbide (SiC). Sapphire is relatively inexpensive, widely available, and highly transparent. Alternatively, sapphire is a poor thermal conductor and therefore less suitable for certain high-power applications. Additionally, in some devices, electrically conductive substrates are preferred and sapphire is insulating rather than conductive. Sapphire also carries a lattice mismatch with (for example) gallium nitride of about 16%.

Silicon carbide has a better thermal conductivity than sapphire and a better lattice match with Group IIII nitrides; i.e., a mismatch of about 3.5% with gallium nitride and only about 1% with aluminum nitride. Silicon carbide can be conductively doped, but is also much more expensive than sapphire.

Thus, depending upon the desired application, both sapphire and silicon carbide can provide an appropriate substrate for Group III nitride epitaxial layers in light emitting diodes.

In almost all cases, using a substrate material that is different from the epitaxial layer material creates an additional set of problems due to different thermal coefficients of expansion (TCEs) and different crystal lattice parameters. As a result, when Group III nitride epitaxial layers are grown on a different substrate, some crystal mismatch will occur, and the resulting epitaxial layer is referred to as being "strained" either in tension or compression by these mismatches. Such mismatches, and the strain they produce, carry with them the potential for crystal defects which in turn affect the optoelectronic characteristics of the crystals and the junctions, and thus correspondingly tend to degrade or even prevent the performance of the photonic device.

The presence of multiple layers of different materials (substrate, epilayers, metal contacts) in light emitting diodes raises additional issues. In particular, light emitted from the active portion must typically pass through or across one or more of such layers before exiting the diode. Additionally, when the diode is packaged as a lamp, the light leaving the diode must travel into, through, and out of the lens material. In each of these circumstances, Snell's law dictates that the photons will be refracted as they pass from one material to the next. The amount that the photons are refracted will depend upon the difference between the refractive indexes of the two materials and the angle of incidence at which the light strikes the interface. Additionally, in almost all circumstances, some of the photons (even if a small percentage) will always be reflected at the interface between the two materials. This is referred to as Fresnel reflection or Fresnel loss.

In a diode or a diode lamp, although some reflected light will still escape the diode at some other location, a certain percentage will be totally internally reflected, never escape the diode or the lamp, and will thus functionally reduce the external quantum efficiency of the diode and of any lamp that includes the diode. Although the individual reduction in the percentage of photons escaping may appear to be relatively small, the cumulative effect can be significant and diodes that are otherwise very similar can have distinctly different performance efficiencies resulting from even these small percentage losses.

Accordingly, increasing the external efficiency of white light emitting diodes remains a continuing goal.

SUMMARY

In one aspect, the invention is a light emitting diode that includes a growth substrate and a substantially transparent ohmic contact on a first surface of the growth substrate. A Group III nitride, light-emitting active region is on a second surface of the growth substrate, a p-type Group III nitride contact layer is on that active region that transmits light generated in the active region and a substantially transparent ohmic contact on the p-type contact layer, In another aspect, the invention is a light emitting diode that includes a growth substrate, and respective p-type and n-type epitaxial layers on the growth substrate, with the epitaxial layers having an index of refraction less than or equal to the index of refraction of the growth substrate. A transparent ohmic contact is on the epitaxial layer that is opposite from the growth substrate.

In yet another aspect, the invention is a light emitting diode that includes a conductive growth substrate, a light emitting active structure formed from at least n-type and p-type epitaxial layers on the growth substrate, with the epitaxial layers having an index of refraction less than or equal to the index of refraction of the conductive growth substrate, a transparent ohmic contact to the epitaxial layer active structure, and a transparent ohmic contact to the conductive growth substrate.

In yet another aspect, the invention is a light emitting diode comprising a conductive mounting substrate, metal bonding layers on the mounting substrate, an epitaxial light emitting active structure on the bonding layers, with the light emitting active structure including at least one n-type and p-type epitaxial layer, portions of a growth substrate material on the active structure, a transparent ohmic contact to the growth substrate, and an ohmic contact to said mounting substrate.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIGS. 1 through 4 are cross-sectional schematic drawings of diodes according to the present invention.

DETAILED DESCRIPTION

Figure 4:
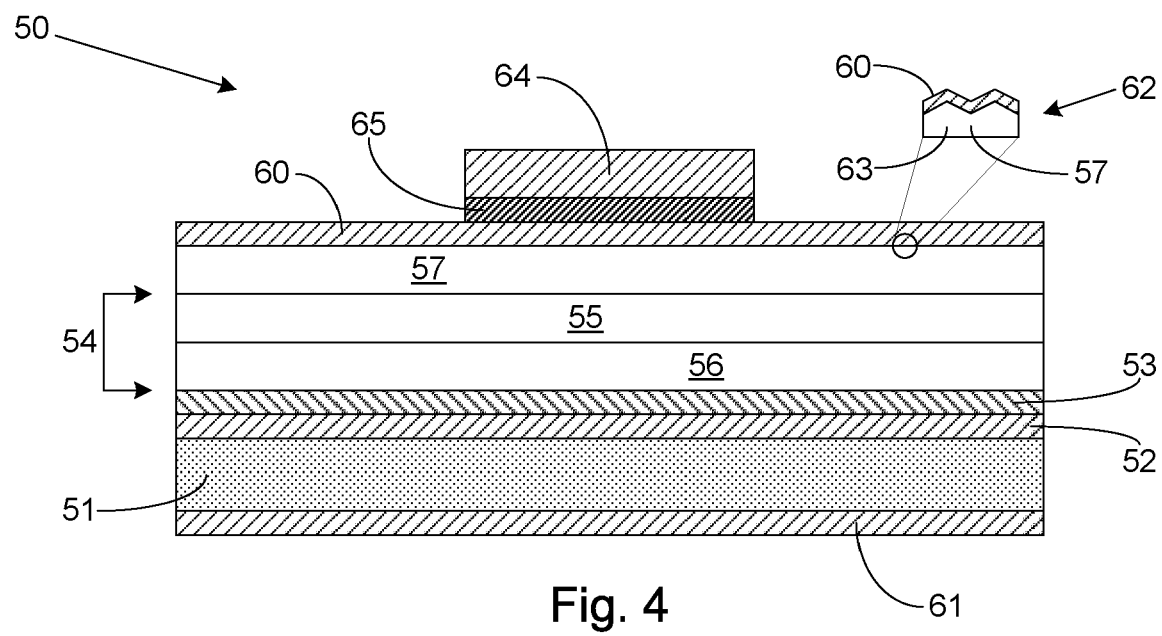

FIG. 1 is a schematic cross-sectional diagram of a first embodiment of a diode according to the present invention and broadly designated at 10. The diode 10 includes a growth substrate 11 typically selected from the group consisting either of silicon carbide or sapphire. Respective n-type 12 and p-type 13 epitaxial layers are on the growth substrate 11. In exemplary embodiments the epitaxial layers 12 and 13 have an index of refraction that is less than or equal to the index of refraction of the growth substrate 11. The diode 10 includes a transparent ohmic contact 14 on the p-type epitaxial layer 13 that is opposite from the growth substrate 11.

The diode 10 further comprises another ohmic contact 15 to the n-type epilayer 12 that is adjacent to the growth substrate 11. In exemplary embodiments, the ohmic contact 15 to the n-type layer 12 is also transparent.

The transparent ohmic contact is most commonly formed of indium tin oxide, but other transparent ohmic materials can include the following: nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$.

In exemplary embodiments, the epitaxial layers 12 and 13 are selected from the Group III nitride material system. In particular, the light emitting layers are most typically formed of gallium nitride (GaN) or indium gallium nitride ($In_xGa_{1-x}N$). Indium gallium nitride offers the advantage of controlling the emission frequency of the layer based upon the atomic fraction of indium in the compound. This is balanced, however, by the increasing instability of indium gallium nitride as the atomic fraction of indium increases. The characteristics of the Group III nitride material system and the growth of Group III nitride epitaxial layers are generally well understood in this art and will not be otherwise discussed herein in detail.

As illustrated in FIG. 1, the transparent ohmic contact 14 covers substantially all of the p-type epitaxial layer 13. In turn, because other metals may be preferable for connecting the diode to circuits or other devices, the diode 10 typically includes a bond pad 16 and optionally a reflective layer 17 that has a reflective surface facing the growth substrate 11. The bond pad 16 will also absorb some light. Thus, although reflecting light back into the epitaxial layers 13 and 12 is less efficient than externally extracting the light, it is more efficient than allowing photons to be absorbed by the bond pad 16.

The ohmic contact 15 to the n-type layer 12 can be transparent and likewise includes a bond pad 20. As used herein, the term "transparent" refers to an ohmic contact that will transmit at least about 70 percent of incident light of the frequencies generated by the diode 10 and preferably 90-100 percent of such light. If the ohmic contact 15 is transparent, then the lower portion of the bond pad 20 is preferably reflective. Alternatively the ohmic contact 15 can be reflective.

FIG. 1 includes dotted lines at 21 that illustrate that the substrate 11 can be shaped to enhance light extraction. Such shaping is set forth in detail in parent application Ser. No. 11/338,918. Although the shaping of the substrate can include a variety of geometry choices, a straightforwardly beveled sidewall as indicated by the dotted lines 21 is appropriate in many circumstances.

In the embodiment illustrated in FIG. 1, both of the ohmic contacts 14 and 15 are made to the same side of the diode 10. The corresponding advantage, however, is that if the substrate 11 is SiC, the low-conductive character will result from its low doping and impurity level which in turn gives it a greater transparency in most cases than an otherwise identical, but conductively doped SiC substrate. Alternatively, if the substrate is sapphire, it's comparatively high electrical resistivity and transparency offer a significant light extraction advantage.

FIG. 1 also includes a magnified breakout view broadly designated at 22 taken from the circle 23 which illustrates a lenticular surface 24 on the transparent ohmic contact 14 and the adjacent epitaxial layer 13. Stated differently, in exemplary embodiments the transparent ohmic contact 14 and the adjacent epitaxial layer (13 in FIG. 1) form a lenticular surface that increases light extraction.

Exemplary (but not limiting) techniques and resulting lenticular surfaces are set forth in copending and commonly assigned application Ser. Nos. 11/082,470 filed Mar. 17, 2005 for "High Efficiency Group III Nitride LED with Lenticular Surface;" 11/461,018 filed Jul. 31, 2006 for "Method of Forming 3D Features on LEDs For Improved Light Extraction;" and 11/343,180 filed Jan. 30, 2006 for, "Improved External Extraction Light Emitting Diode Based Upon Crystallographic Faceted Surfaces." The contents of each of these applications are incorporated entirely herein by reference. As respectively indicated therein, such lenticular surfaces can be generated with an embossing technique or chemically developed. Such lenticular surfaces are sometimes referred to as being "roughened" or "textured" surfaces.

FIGS. 2 and 3 illustrate additional embodiments of the invention. FIG. 2 illustrates a diode broadly designated 26. The diode includes a silicon carbide substrate 27 with a substantially transparent ohmic contact 30 on a first surface of the substrate 27. A Group III nitride light emitting active region 31 is on a second surface of the substrate 27. The active region 31 potentially includes four or more layers as illustrated in the breakout illustration broadly designated 32. These include an optional (but typical) buffer layer 33 for providing a crystal and electronic transition from the substrate 27; an n-type epitaxial layer 34 on the buffer layer 33; a p-type epitaxial layer 35 on the n-type layer 34; and optionally a p-type Group III nitride contact layer 36 on the epitaxial layers 34 and 35 that forms the active region.

A substantially transparent ohmic contact 37 is on the p-type contact layer 36. The transparent ohmic contact layers 30 and 37 are typically formed of indium tin oxide (ITO), but can include the other compositions referred to with respect to FIG. 1.

The growth substrate 27 is typically formed of silicon carbide. Sapphire ($Al_2O_3$) is somewhat easier to obtain in high transparency, but cannot be conductively doped. Alternatively, silicon carbide (SiC) provides a closer lattice matched to the Group III nitride material system and can be conductively doped if desired (which in turn increases the number of design choice available using silicon carbide).

FIG. 2 illustrates that the diode 26 further includes an optional light transmitting silicon nitride composition passivation layer 40 covering the ohmic contact 37 and a bond pad 41 to the p-type layer 36. The silicon nitride passivation layer 40 can be stoichiometric (i.e., $Si_3N_4$) or non-stoichiometric but is preferably sputter deposited in order to reduce or eliminate the presence of hydrogen which can adversely affect the structure and performance of Group III nitride layers.

FIG. 2 includes a second magnified breakout view designated at 42 that illustrates that the substrate 27 and the ohmic contact 30 can define a lenticular surface therebetween.

In the embodiments illustrated in FIGS. 2 and 3, the substrate 27 is conductive. This permits the device to be formed in a vertical orientation (i.e., ohmic contacts at axially opposite ends of the device) which has advantages in certain end uses and standard packaging and circuit mounting. As noted above, however, the doping required to make the substrate 27 conductive can reduce its transparency.

Accordingly, persons of skill in this art will choose the appropriate substrate and resulting diode structure based upon the overall advantages in any one or more given applications.

FIG. 3 is a cross-sectional schematic diagram of a diode 44 according to the invention that is essentially the same as FIG. 2, but that illustrates an additional metal contact 45 to the substrate 27. In this embodiment, the contact 45 may be less transparent than the remainder of the ohmic contacts 37 or 30, and thus is generally maintained at a smaller size that is sufficient to provide the desired electrical characteristics while minimizing the area that it covers. The transparent ohmic contact 30 covers the remainder of the surface of the substrate 27 in a matter analogous to FIG. 2.

Both FIGS. 2 and 3 illustrates that the substrate 27 can be shaped as indicated by the side walls 46 in FIG. 3. As in the embodiment of FIG. 1, the shaping can take a variety of geometries including those set forth in the parent application Ser. No. 11/338,918.

FIG. 4 is another diode broadly designated at 50 according to the present invention. In this embodiment, the diode 50 includes a conductive mounting substrate 51. As used herein, the term "mounting substrate" (or "sub-mounting substrate" or "carrier substrate") refers to a substrate other than the one upon which the epitaxial layers in the active structure were originally grown. The use of mounting substrates, conductive or otherwise, is set forth in several co-pending and commonly assigned applications including Ser. Nos. 11/428,158 filed Jun. 30, 2006 for, "Nickel-Tin Bonding System for Semiconductor Wafers and Devices;" and 11/534,317 filed Sep. 22, 2006 for "Modified Gold-Tin System with Increasing Melting Temperature for Wafer Bonding." The contents of these are incorporated entirely here by reference and it will be understood that these are illustrative, rather than limiting, of the claimed invention.

Basically, in growth substrate diodes, the growth substrate supports the epitaxial layers and remains as the structural portion of the diode. In some cases (e.g., parent application Ser. No. 11/338,918), the epilayers are mounted to a lead frame with the growth substrate forming the main emitting surface of the diode. These are generally referred to as "flip chip" orientations.

For a number of reasons, however, some structures offer advantages when the growth substrate is partially or entirely removed and replaced by a carrier substrate (which can even be the same material as the growth substrate). For example, in addition to some structural advantages, growing Group III nitride epitaxial layers on silicon carbide and then removing the silicon carbide substrate can reduce the overall cost of the resulting diodes, because the removed silicon carbide substrate (which can be used as a wafer and removed as a wafer) can be reused. Thus, although silicon carbide is comparatively more expensive than sapphire or other substrate materials, reusing it in this fashion moderates the cost of fabrication while providing the growth advantages of SiC for Group III nitride epilayers.

The diode 50 includes one or more metal bonding layers, two of which are illustrated at 52 and 53 in FIG. 4. The bonding layers 52 and 53 join the carrier substrate 51 to an epitaxial light emitting active structure indicated by the brackets 54. The active structure 54 includes at least one n-type layer 55 and one p-type layer 56. Nevertheless, it will be understood that additional layers such as quantum wells or heterostructures or can be present as well. Portions of the original growth substrate material 57 (e.g., silicon carbide) remain on the active structure 54. A transparent ohmic contact 60 is on the growth substrate portions 57 and an ohmic contact 61 is on the mounting substrate 51.

In some embodiments, the ohmic contact 61 to the mounting substrate can be transparent. As stated earlier, such a transparent contact will transmit at least about 70 percent of the light emitted by the active portion 54, in some cases more than 90 percent, and in some cases 100 percent of the frequencies emitted by the active portion 54.

In exemplary embodiments, at least one of the layers metal bonding 53 or 52 are reflective, or an additional reflective layer can be optionally along with the illustrated layers 52 and 53.

As illustrated by the breakout diagram 62, and in a matter analogous to the earlier embodiments, the growth substrate portions 57 and the ohmic contact 60 can define a lenticular surface 62. As in the other embodiments, the lenticular surface 62 can be formed in several known techniques and generally serves to enhance the external extraction of light from the diode 50.

In many embodiments, the residual growth substrate portion 57 is silicon carbide because silicon carbide is a favored substrate material for the epitaxial growth of Group III nitride layers that are most typically used for the active portion 54 and the epitaxial layers 55 and 56. As noted earlier herein, silicon carbide provides an excellent thermal and lattice match to the Group III nitride material system.

As FIG. 4 illustrates, the diode 50 has a flip-chip orientation with the p-type epitaxial layer 56 on the metal bonding layers 53 and 52 and the n-type epitaxial layer 55 on the p-type layer 56.

The diode 50 can include a bond pad 64 that provides an appropriate connection for circuits or other devices. The bond pad can also include at least one reflective layer 65 that faces the epitaxial layers that form the active portion 54. As noted previously, although reflecting the light back into the active layers has some disadvantages (because these layers absorb photons for reasons directly related to their emission of photons), the bond pad 64 also absorbs emitted photons and thus reflecting photons in another direction is preferred and will increase light extraction.

The transparent ohmic contacts are typically formed of indium tin oxide or one of the other compositions described earlier with respect to the other embodiments.

In each of the illustrated embodiments, the ohmic contact can be formed of multiple layers of conductive oxides to form a graded index of refraction fraction that minimizes Fresnel loss as photons exit the diode. Alternatively, the atomic fraction of indium in ITO can be graded through the contact for the same purpose.

Figure 5:
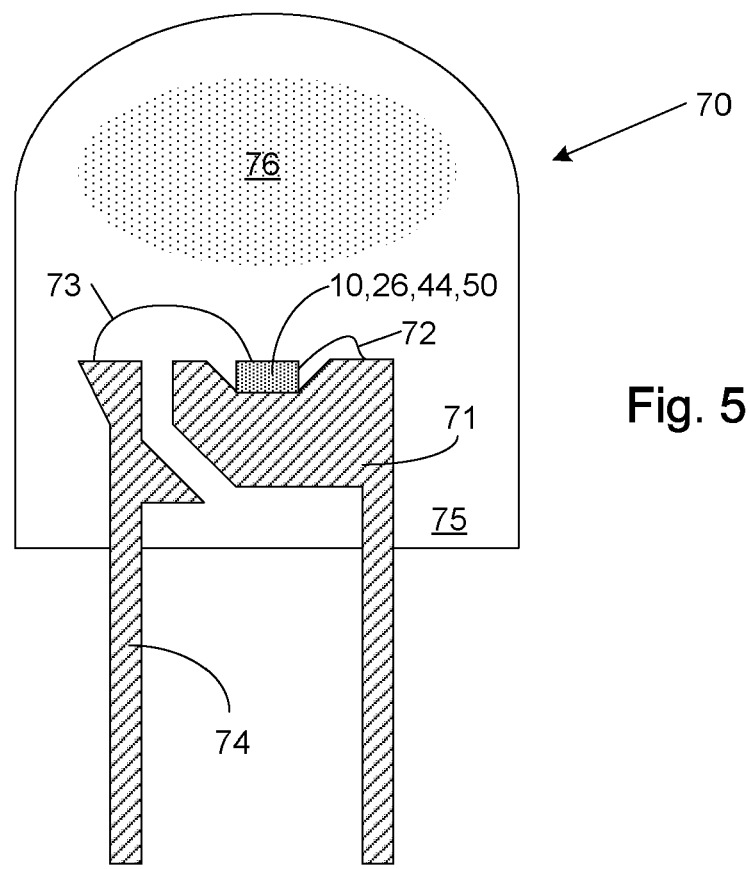
FIG. 5 is a cross-sectional diagram of a light emitting diode lamp according to the present invention.

FIG. 5 is a schematic diagram of a light emitting diode lamp 70 according to the present invention. The lamp 70 includes a light emitting diode according to the invention which can include any of the embodiments 10, 26, 44 or 50 described with respect FIGS. 1-4.

The diode 10 (or other embodiments) is positioned on a header 71 which forms an electrical contact to the diode 10 through the wire 72. The header 71 also acts as an electrode for the lamp 70. A second wire 73 provides electrical contact to a second electrode 74. The term "header" is used in a broad sense to describe an appropriate electromechanical support for an LED in the context of a lamp.

An encapsulant 75 covers the LED 10 and portions of the header 71 and the electrode 74. The encapsulant 75 provides a lens for the lamp 70, and also provides environmental protection to the diode 10. As set forth in commonly assigned and co-pending application Ser. No. 11/676,715 filed Feb. 20, 2007 for "Group III Nitride Diodes on Low Index Carrier Substrates," the index of refraction of a mounting substrate (e.g. 51 in FIG. 4) can be carefully matched to the index of refraction of the encapsulant 75 to minimize Fresnel loss between the substrate 51 and the encapsulant 75. The contents of Ser. No. 11/676,715 are incorporated entirely herein by reference.

As set forth earlier, in certain embodiments, the encapsulant contains a phosphor indicated by the shaded portion 76 which typically down-converts the light emitted by the diode 10. Most typically, because the Group III nitride material system emits in the blue portion of the spectrum, the phosphor 76 responds to the blue frequencies and emits primarily (although not exclusively) in the yellow-red portion of the visible spectrum. The combination of the blue light from the diode 10 and the yellow light from the phosphor 76 produces an external emission of white light. Cerium-doped yttrium aluminum garnet (YAG) is an exemplary phosphor for this purpose.

Figure 6:
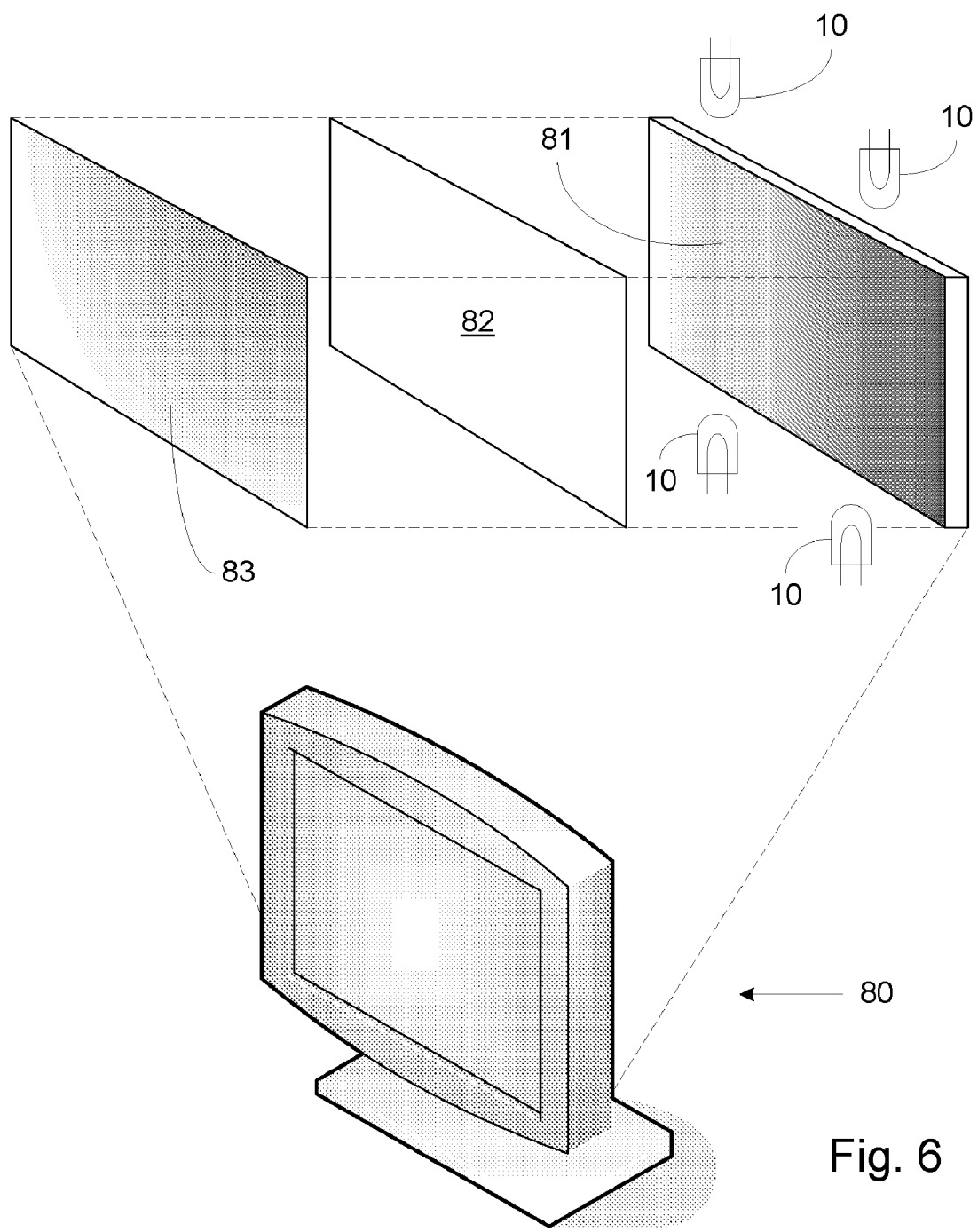
FIG. 6 is a partially exploded schematic diagram of a display that incorporates lamps according to the present invention.

FIG. 6 illustrates that lamps according to the invention, which are schematically illustrated at 10, but can be any of the embodiments described herein, can be incorporated into a display broadly designated at 80. The nature and operation of various displays is generally well-understood and will not be described in detail herein other than to point out that they typically include the diode lamp 10 and a light distributor 81 which both diffuses light in its main plane, and also redirects some of the light perpendicularly to its main plane.

In many circumstances, the display will also include a set of liquid crystals schematically designated by the rectangle 82, and an appropriate set of one or more color filters schematically illustrated by the single rectangle 83. Other elements can be included in the display, but are omitted here for the sake of clarity. The liquid crystals generally operate in and "on" or "off" orientation when a signal is applied to them, so that in combination with the color filters 83 the display 80 produces a color image.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
a growth substrate;
a substantially transparent ohmic contact on a first surface of said growth substrate;
a Group III nitride, light-emitting active region on a second surface of said growth substrate;
a p-type Group III nitride contact layer on said active region that transmits light generated in said active region; and
a substantially transparent ohmic contact on said p-type contact layer;
wherein at least one of said substantially transparent ohmic contacts is graded in composition through the contact to form a graded index of refraction across the contact;
wherein said substantially transparent ohmic contact comprises indium tin oxide that is graded in the atomic fraction of indium through the contact to form a graded index of refraction across the contact.

2. A light emitting diode according to claim 1 further comprising:
a buffer structure on the second surface of said growth substrate opposite said ohmic contact; and
said Group III nitride, light-emitting active region on said buffer structure.

3. A light emitting diode according to claim 1 wherein at least one of said transparent ohmic contacts comprises a material selected from the group consisting of indium tin oxide, nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$.

4. A light emitting diode according to claim 1 wherein each of said transparent ohmic contacts comprises a material selected from the group consisting of indium tin oxide, nickel oxide, zinc oxide, cadmium tin oxide, titanium tungsten nickel, indium oxide, tin oxide, magnesium oxide, $ZnGa_2O_4$, $SnO_2/Sb$, $Ga_2O_3/Sn$, $AgInO_2/Sn$, $In_2O_3/Zn$, $CuAlO_2$, $LaCuOS$, $CuGaO_2$, and $SrCu_2O_2$.

5. A light emitting diode according to claim 1 wherein said growth substrate comprises conductive silicon carbide.

6. A light emitting diode according to claim 1 further comprising a light transmitting, silicon nitride composition passivation layer on said ohmic contact to said p-type layer.

7. A light emitting diode according to claim 6 wherein said passivation layer is selected from the group consisting of stoichiometric and non-stoichiometric silicon nitride.

8. A light emitting diode according to claim 6 comprising a sputter-deposited silicon nitride layer.

9. A light emitting diode according to claim 1 wherein said substrate and said ohmic contact to said substrate define a lenticular surface therebetween.

10. An LED lamp comprising:
a header;
a light emitting diode according to claim 1 on said header; and
an encapsulant on said light emitting diode on said header.

11. An LED lamp according to claim 10 further comprising a phosphor in said encapsulant that down-converts frequencies emitted by said light emitting diode.

12. A display comprising:
at least one LED lamp according to claim 10;
liquid crystals;
a light distributor; and
color filters.

13. A light emitting diode according to claim 1 wherein at least one of said substantially transparent ohmic contacts comprises a plurality of layers of conductive oxides that form a graded index of refraction that minimizes Fresnel loss as photons exit the diode.

14. A light emitting diode comprising:
a growth substrate;
respective p-type and n-type epitaxial layers on said growth substrate, said epitaxial layers having an index of refraction less than or equal to the index of refraction of said growth substrate; and
a transparent ohmic contact on said epitaxial layer that is opposite from said growth substrate, wherein said transparent ohmic contact is graded in composition through the contact to form a graded index of refraction across the contact;
wherein said transparent ohmic contact comprises indium tin oxide that is graded in the atomic fraction of indium through the contact to form a graded index of refraction across the contact.

15. A light emitting diode according to claim 14 further comprising an ohmic contact to said epilayer that is adjacent said growth substrate.

16. A light emitting diode according to claim 14 comprising a transparent ohmic contact to said epilayer that is adjacent said growth substrate.

17. A light emitting diode according to claim 14 wherein said transparent ohmic contact comprises a material selected from the group consisting of indium tin oxide, nickel oxide, zinc oxide, cadmium tin oxide, titanium tungsten nickel, indium oxide, tin oxide, magnesium oxide, $ZnGa_2O_4$, $SnO_2$/Sb, $Ga_2O_3$/Sn, $AgInO_2$/Sn, $In_2O_3$/Zn, $CuAlO_2$, $LaCuOS$, $CuGaO_2$, and $SrCu_2O_2$.

18. A light emitting diode according to claim 14 wherein said growth substrate is silicon carbide.

19. A light emitting diode according to claim 18 wherein:
said epitaxial layers are selected from the Group III nitride material system;
said respective n-type layer is on said growth substrate and said respective p-type layer is on said n-type layer; and
said transparent ohmic contact is on said p-type layer of Group III nitride, 20. A light emitting diode according to claim 19 wherein said epitaxial layers comprise a material selected from the group consisting of gallium nitride, indium nitride, and indium aluminum gallium nitride.

21. A light emitting diode according to claim 19 wherein:
said transparent ohmic contact covers substantially all of said p-type epitaxial layer; and
said diode further comprises a bond pad to said transparent ohmic contact.

22. A light limiting diode according to claim 21 wherein said bond pad includes at least one layer that has at least one reflective surface facing said growth substrate.

23. A light emitting diode according to claim 20 comprising a reflective ohmic contact to said n-type epitaxial layer.

24. A light emitting diode according to claim 23 comprising a bond pad to said n-type epitaxial layer.

25. A light emitting diode according to claim 14 wherein said substrate is shaped to enhance light extraction.

26. A light emitting diode according to claim 25 wherein said substrate includes beveled sidewalls.

27. A light emitting diode according to claim 14 further comprising a lenticular surface on said transparent ohmic contact and said epitaxial layers.

28. An LED lamp comprising:
a header;
a light emitting diode according to claim 14 on said header; and
an encapsulant on said light emitting diode on said header.

29. An LED lamp according to claim 28 further comprising a phosphor in said encapsulant that down-converts frequencies emitted by said light emitting diode.

30. A display comprising:
at least one LED lamp according to claim 28;
liquid crystals;
a light distributor; and
color filters.

31. A light emitting diode according to claim 14 wherein said transparent ohmic contact comprises a plurality of layers of conductive oxides that form a graded index of refraction that minimizes Fresnel loss as photons exit the diode.

32. A light emitting diode comprising:
a growth substrate;
a group III nitride light-emitting active region on said growth substrate; and
a substantially transparent ohmic contact on said active region and opposite said growth substrate, wherein said substantially transparent ohmic contact comprises indium tin oxide that is graded in the atomic fraction of indium through the contact to form a graded index of refraction across the contact.

33. A light emitting diode according to claim 32 comprising an ohmic contact on said growth substrate and opposite said active region.

34. A light emitting diode according to claim 32 comprising a substantially transparent ohmic contact on said growth substrate and opposite said active region.

35. A light emitting diode according to claim 32 comprising a reflective ohmic contact on said growth substrate and opposite said active region.

36. A light emitting diode according to claim 32 wherein said substantially transparent ohmic contact comprises a material selected from the group consisting of nickel oxide, zinc oxide, cadmium tin oxide, titanium tungsten nickel, indium oxide, tin oxide, magnesium oxide, $ZnGa_2O_4$, $SnO_2$/Sb, $Ga_2O_3$/Sn, $AgInO_2$/Sn, $In_2O_3$/Zn, $CuAlO_2$, $LaCuOS$, $CuGaO_2$, and $SrCu_2O_2$.

37. A light emitting diode according to claim 32 wherein said growth substrate is silicon carbide.

38. A light emitting diode according to claim 32 comprising a p-type Group III nitride contact layer between said active region and said substantially transparent ohmic contact.

39. A light emitting diode according to claim 32 wherein said active region comprises a material selected from the group consisting of gallium nitride, indium nitride, and indium aluminum gallium nitride.

40. A light emitting diode according to claim 32 wherein said substrate is shaped to enhance light extraction.

41. A light emitting diode according to claim 32 wherein said substrate includes beveled sidewalls.

42. A light emitting diode according to claim 32 further comprising a lenticular surface on said substantially transparent ohmic contact and said active region.

43. A light emitting diode according to claim 32 further comprising a light transmitting, silicon nitride composition passivation layer on said substantially transparent ohmic contact.

44. A light emitting diode according to claim 43 wherein said passivation layer is selected from the group consisting of stoichiometric and non-stoichiometric silicon nitride.

45. An LED lamp comprising:
a header;
a light emitting diode according to claim 32 on said header; and
an encapsulant on said light emitting diode on said header.

* * * * *